(12) United States Patent
Chang et al.

(10) Patent No.: US 7,990,080 B2
(45) Date of Patent: Aug. 2, 2011

(54) SYSTEM AND METHOD FOR CONTROLLING MULTIPLE LIGHT SOURCES

(75) Inventors: Chih-Kuang Chang, Taipei Hsien (TW); Wei-Qi Sun, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 493 days.

(21) Appl. No.: 12/195,406

(22) Filed: Aug. 20, 2008

(65) Prior Publication Data

US 2009/0102397 A1    Apr. 23, 2009

(30) Foreign Application Priority Data

Oct. 23, 2007  (CN) .......................... 2007 1 0202220

(51) Int. Cl.
*H05B 37/00* (2006.01)
(52) U.S. Cl. ........ 315/312; 315/318; 315/294; 315/297; 315/360; 700/20; 700/24
(58) Field of Classification Search .......... 315/291–294, 315/297, 307, 312, 316, 318, 360; 700/20, 700/24, 84, 10, 75
See application file for complete search history.

(56) References Cited

U.S. PATENT DOCUMENTS

| | | | | | |
|---|---|---|---|---|---|
| 3,898,643 | A | * | 8/1975 | Ettlinger .......................... | 700/84 |
| 4,980,806 | A | * | 12/1990 | Taylor et al. ..................... | 362/85 |
| 7,202,613 | B2 | * | 4/2007 | Morgan et al. ................. | 315/312 |
| 7,332,877 | B2 | * | 2/2008 | Crodian et al. ................. | 315/297 |
| 7,397,195 | B2 | * | 7/2008 | Yu et al. ......................... | 315/194 |
| 7,729,941 | B2 | * | 6/2010 | Zampini et al. .............. | 705/14.4 |

\* cited by examiner

*Primary Examiner* — Haissa Philogene
(74) *Attorney, Agent, or Firm* — Frank R. Niranjan

(57) ABSTRACT

A system for controlling multiple light sources is provided. The system includes a controller, a digital to analog converter (DAC), and at least one power amplifier. The controller is configured for receiving light control data for at least one light circuit, and for determining a digital luminance signal and an encoded address for each light circuit according to the light control data. The DAC is connected to the controller and configured for receiving the digital luminance signal and the encoded address for each light circuit, converting the digital luminance signal into an analog luminance signal, and for outputting the analog luminance signal according to the encoded address. Each power amplifier is connected to the DAC, and is configured for amplifying the analog luminance signal for the light circuit so as to drive the light circuit to control a corresponding light source.

10 Claims, 3 Drawing Sheets

SYSTEM AND METHOD FOR CONTROLLING MULTIPLE LIGHT SOURCES

FIELD OF THE INVENTION

Embodiments of the present disclosure relate to systems and methods for light control, and more particularly to a system and method for controlling multiple light sources.

DESCRIPTION OF RELATED ART

Light control plays an important role in measurements, especially in precision measurements. In order to provide preferable lighting effects, the intensity of a light is required to be adjustable. A light may be controlled by a control circuit comprising a controller, a digital to analog converter (DAC), and a power amplifier.

For more complicated measurements, a plurality of lights are supplied in a measuring machine. Correspondingly, each of the lights is required to be adjustable. With the increase of lights to be controlled, a circuit for controlling all the lights becomes expensive and large. Additionally, control circuits usually are designed to control only one light. Furthermore, DACs in such control circuits may not be available sometimes.

What is needed, therefore, is a system and method for controlling multiple light sources allowing for a higher availability and cheaper cost.

SUMMARY

A system for controlling multiple light sources is provided. The system includes a controller, a digital to analog converter (DAC), and at least one power amplifier. The controller is configured for receiving light control data for at least one light circuit, and for determining a digital luminance signal and an encoded address for each light circuit according to the light control data, wherein each light circuit is configured for controlling a light source. The DAC is connected to the controller. The DAC is configured for receiving the digital luminance signal and the encoded address for each light circuit from the controller, converting the digital luminance signal into an analog luminance signal, and for outputting the analog luminance signal according to the encoded address. Each power amplifier corresponding to one light circuit is connected to the DAC, and is configured for amplifying the analog luminance signal for the light circuit so as to drive the light circuit to control a corresponding light source.

Other objects, advantages and novel features will become more apparent from the following detailed description of certain embodiments of the present disclosure when taken in conjunction with the accompanying drawings, in which:

DETAILED DESCRIPTION OF CERTAIN INVENTIVE EMBODIMENTS

Figure 1:
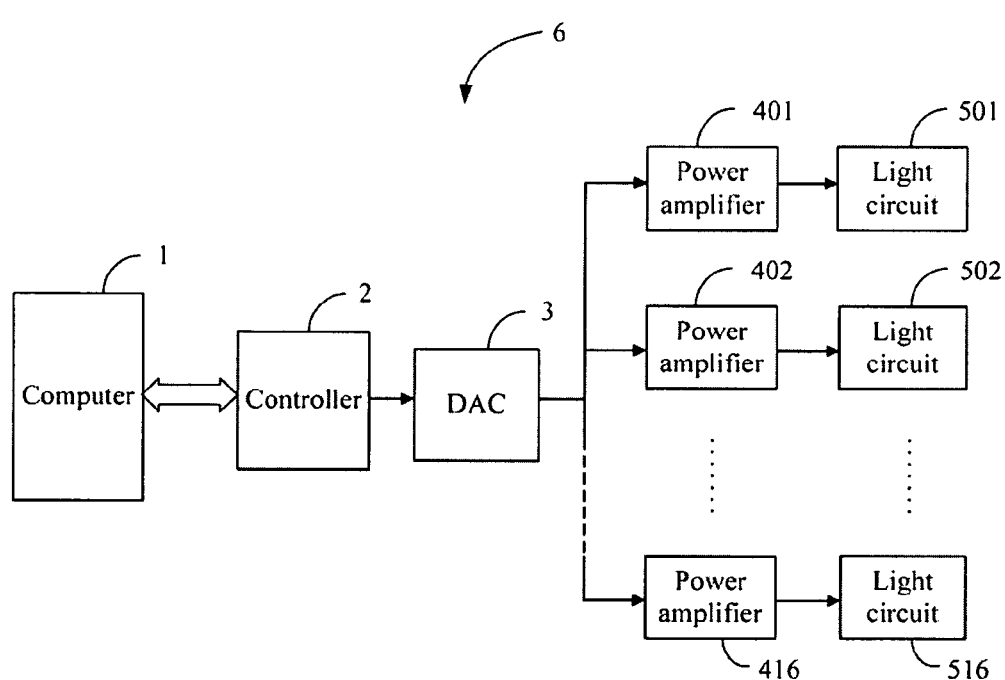
FIG. 1 is a block diagram of one embodiment of a system for controlling multiple light sources.

FIG. 1 is a block diagram of one embodiment of a system 6 for controlling multiple light sources. The system 6 includes a computer 1, a controller 2, a digital to analog converter (DAC) 3, a plurality of power amplifiers (shown as 401-416) and a plurality of light circuits (shown as 501-516). The controller 2 is connected to the computer 1 and the DAC 3. The DAC 3 is further connected to the power amplifiers 401-416. The power amplifiers 401-416 are respectively connected to the light circuits 501-516. It may be understood that each of the light circuits 501-516 may include a light source to be controlled.

The computer 1 is configured for receiving access information and light control data for the light circuits 501-516 via a user interface. The computer 1 sends the access information and the light control data to the controller 2. Furthermore, the computer 1 may be further configured for displaying errors when performing a controlling multiple light sources. The errors may include an invalid serial port number for the computer 1, an error of invalid access information, and a data transmission error between the computer 1 and the controller 2.

The controller 2 is configured for receiving the access information and the light control data from the computer 1 and verifying the access information. The controller 2 is further configured for determining a digital luminance signal and an encoded address for each of the light circuits 501-516 according to the light control data, and sending the digital luminance signal and the encoded address for each of the light circuits 501-516 to the DAC 3. In one embodiment, the encoded address may be a binary code. In one example, the encoded address may be a 4-bit binary code, such as "0000," "0001," ..., "1111," for example, wherein "0000" corresponds to the light circuit 501, "0001" corresponds to the light circuit 502, ..., and "1111" corresponds to the light circuit 516.

The controller 2 may be a programmable device suitable for an embedded system, such as a single chip microcomputer (SCM), a digital signal processor (DSP), or a programmable logic controller (PLC). Accordingly, the controller 2 has a built-in memory for storing the digital luminance signals. In one embodiment, the controller 2 may be a SCM, which is connected to the computer 1 via a serial port. It may be understood that a plurality of parameters may be specified for serial communication between the computer 1 and the SCM. The parameters may include a baud rate, a data bit length, an optional parity bit, and a stop bit length for the computer 1, and a baud rate, a data bit length, an optional parity bit, and a stop bit length for the controller 2. The baud rate, the data bit length, the optional parity bit, and the stop bit length for the computer 1 may be consistent with the baud rate, the data bit length, the optional parity bit, and the stop bit length for the controller 2. Moreover, a serial port number may be for the computer 1. However, in other embodiments, the controller 2 may be connected to the computer 1 via other ports, such as USB or General Purpose Interface Bus (GPIB).

The DAC 3 is configured for receiving the digital luminance signal and the encoded address for each of the light circuits 501-516 from the controller 2. The DAC 3 converts each digital luminance signal into an analog luminance signal. The DAC 3 is further configured for outputting the analog luminance signal to a corresponding power amplifier according to the encoded address. In one example, the DAC 3 receives a digital luminance signal of "00011111" and an encoded address of "0000," so the DAC 3 converts the digital luminance signal of "00011111" into a corresponding analog luminance signal, and sends the analog luminance signal to the corresponding power amplifier 401. In one embodiment, the power amplifiers 401-416 share one DAC, such as the DAC 3. Depending on the embodiment, more DACs and power amplifiers may be added to the system 6 if more lights are to be controlled. In one embodiment, the DAC 3 is an 8-bit DAC.

Each of the power amplifiers 401-416 is configured for receiving and amplifying a corresponding analog luminance signal received from the DAC 3 so as to drive a corresponding light circuit. Each of the power amplifiers 401-416 includes a triode that can amplify the analog luminance signal, and can further act as a switch.

Figure 2:
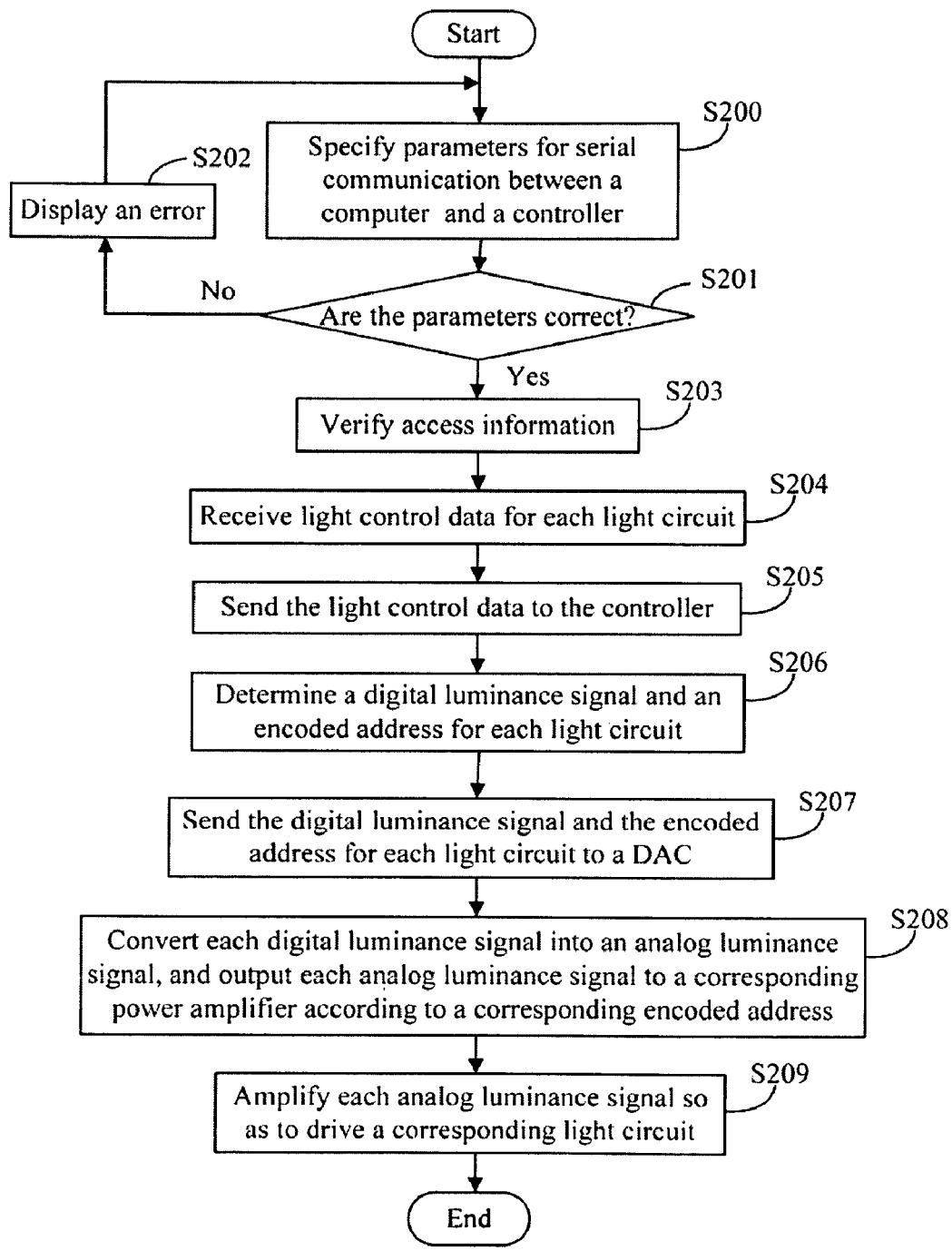
FIG. 2 is a main flowchart of one embodiment of a method for controlling multiple light sources.

FIG. 2 is a main flowchart of one embodiment of a method for controlling multiple light sources. The method of FIG. 2 may be used to control multiple light sources to provide preferable lighting effects. Depending on the embodiment, additional blocks may be added, others removed, and the ordering of the blocks may be changed.

In block S200, a plurality of parameters are specified for serial communication between the computer 1 and the controller 2. In one example, the parameters include a serial port number for the computer 1, a baud rate, a data bit length, an optional parity bit, and a stop bit length for the computer 1, and a baud rate, a data bit length, an optional parity bit, and a stop bit length for the controller 2. As mentioned above, the baud rate, the data bit length, the optional parity bit, and the stop bit length for the computer 1 may be consistent with the baud rate, the data bit length, the optional parity bit, and the stop bit length for the controller 2.

In block S201, the computer 1 determines if the parameters specified in block S200 are correct. If the parameters are incorrect, in block S202, then the computer 1 displays an error, such as an invalid serial port number for the computer 1 on a user interface, and the flow may move to block S200. If the parameters are correct, in block S203, then the computer 1 verifies access information determined by a user. Further details of block S203 are described in FIG. 3.

If the access information is valid, in block S204, then the computer 1 receives light control data for each light circuit determined by the user.

It may be understood that a light control data may include a light luminance data for defining a brightness of a light and a light circuit ID for defining a light circuit to be controlled. In one example with respect to FIG. 1, a light circuit ID of 1 corresponds to the light circuit 501, a light circuit ID of 2 corresponds to the light circuit 502 and a light circuit ID of 16 corresponds to the light circuit 516.

It may be further understood that the light luminance data may be inputted manually or automatically. Manually inputting means manually controlling a light luminance slider, inputting a value of a light luminance data, or the like. Automatically inputting means by calling a software interface. If the light luminance data is predetermined as an integer ranging from 0-255, then a valid value of light luminance inputted by a user is in a range from 0-255, and a location of the light luminance slider refers to an integer ranging from 0-255.

In block S205, the computer 1 sends the light control data to the controller 2 via a serial port.

In block S206, the controller 2 receives the light control data, and determines a digital luminance signal and an encoded address for each of the light circuits 501-516 according to the light control data.

As mentioned above, the encoded address may be a binary code. In one example, the encoded address may be a 4-bit binary code, such as "0000," "0001," . . . , "1111" respectively corresponding to a light circuit ID of "1," a light circuit ID of "2," . . . , and a light circuit ID of "16."

Additionally, the controller 2 has a built-in memory that stores a plurality of digital luminance signals in different memory cells of the memory with different memory addresses. Each digital luminance signal corresponds to a certain light luminance data. In one embodiment, there is a one-to-one correspondence between digital luminance signals and light luminance data, and a digital luminance signal may be stored as a byte in a memory cell with a certain memory address. In one example, a digital luminance signal of "00000000" corresponding to a light luminance data of "0" is stored in a memory cell with a memory address of "0x0100," a digital luminance signal of "00000001" corresponding to a light luminance data of "1" is stored in a memory cell with a memory address of "0x0101," . . . , and a digital luminance signal "11111111" corresponding to a light luminance data of "256" is stored in a memory cell with a memory address of "0x01FF."

It may be understood that an analog luminance signal amplified by a power amplifier is initiated from a light luminance data. It may be further understood that a small analog luminance signal cannot drive a light circuit, i.e. cannot light a light source. In one embodiment, several digital luminance signals corresponding to several small light luminance data (some data larger than "0" and smaller than a predetermined number, e.g., "1" and "2") are stored as larger data. For example, a digital luminance signal corresponding to a light luminance data of "1" is stored as "00001000" instead of "00000001," a digital luminance signal corresponding to a light luminance data of "2" is stored as "00001001" instead of "00000010." By this means, an analog luminance signal initiated from a small light luminance data can eventually drive one corresponding light circuit.

In block 206, the controller 2 decodes the light luminance data received from the computer 1 into a corresponding memory address, and then obtains a digital luminance signal from the memory address.

In one example as described above, a digital luminance signal of "00000000" corresponding to a light luminance data of "0" is stored in a memory cell with a memory address of "0x0100," a digital luminance signal "00001000" corresponding to a light luminance data of "1" is stored in a memory cell with a memory address of "0x0101," . . . , a digital luminance signal of "00011111" corresponding to a light luminance data of "31" is stored in a memory cell with a memory address of "0x011F," . . . , a digital luminance signal of "11111111" corresponding to a light luminance data of "0" is stored in a memory cell with a memory address of "0x01FF." In one example, if the controller 2 receives a light luminance data of "00011111," then the controller 2 determines a memory address of "0x011F," and obtains a digital luminance signal of "00011111" according to the memory address of "0x011F." In another example, if the controller 2 receives a light luminance data of 1, then the controller 2 determines a memory address of "0x001," and obtains a digital luminance signal of "00001000" according to the memory address of "0x0101."

Furthermore, in block 206, the controller 2 determines if the light luminance data received is valid. If the light luminance data is invalid, then the controller 2 discards the light luminance data without sending to the DAC 3. In one example, assuming that the light luminance data is specified as an integer ranging from 0-255, if a light luminance data manually inputted by a user is an integer of −50, then the light luminance data is discarded.

In block S207, the controller 2 sends the digital luminance signal and the encoded address for each of the light circuit 501-516 to the DAC 3.

In block S208, the DAC 3 converts each digital luminance signal into an analog luminance signal, and outputs each analog luminance signal to a corresponding power amplifier (i.e. one of the power amplifiers 401-416) according to a corresponding encoded address. In one example, if the DAC 3 receives a digital luminance signal of "00011111" and an encoded address of "0000," then the DAC 3 converts the digital luminance signal of "00011111" into a corresponding analog luminance signal, and sends the analog luminance signal to the power amplifier 401. In another example, if the DAC 3 receives a digital luminance signal of "01101001" and an encoded address of "1111," then the DAC 3 converts the digital luminance signal of "01101001" into a corresponding analog luminance signal, and sends the analog luminance signal to the power amplifier 416.

In block S209, each of the power amplifiers 401-416 amplifies a corresponding analog luminance signal so as to drive a corresponding light circuit (i.e. one of the light circuits 501-516. For example, the power amplifier 401 amplifies a corresponding analog luminance signal so as to drive the light circuit 501. Each of the power amplifiers 401-416 includes a triode that can amplify the analog luminance signal, and can further act as a switch.

Moreover, in block S206, when receiving the light control data from the computer 1, the controller 2 sends the light control data back to the computer 1 so that the computer 1 may verify if the serial communication is correct. It may be understood that if there is something wrong about the serial communication between the computer 1 and the controller 2, then the light control data received from the controller 2 may be different from the original light control data sent to the controller 2. If there are any discrepancies between the original light control data sent to the controller 2 and the light control data received from the controller 2, then the computer 1 may display a data transmission error between the computer 1 and the controller 2.

Figure 3:
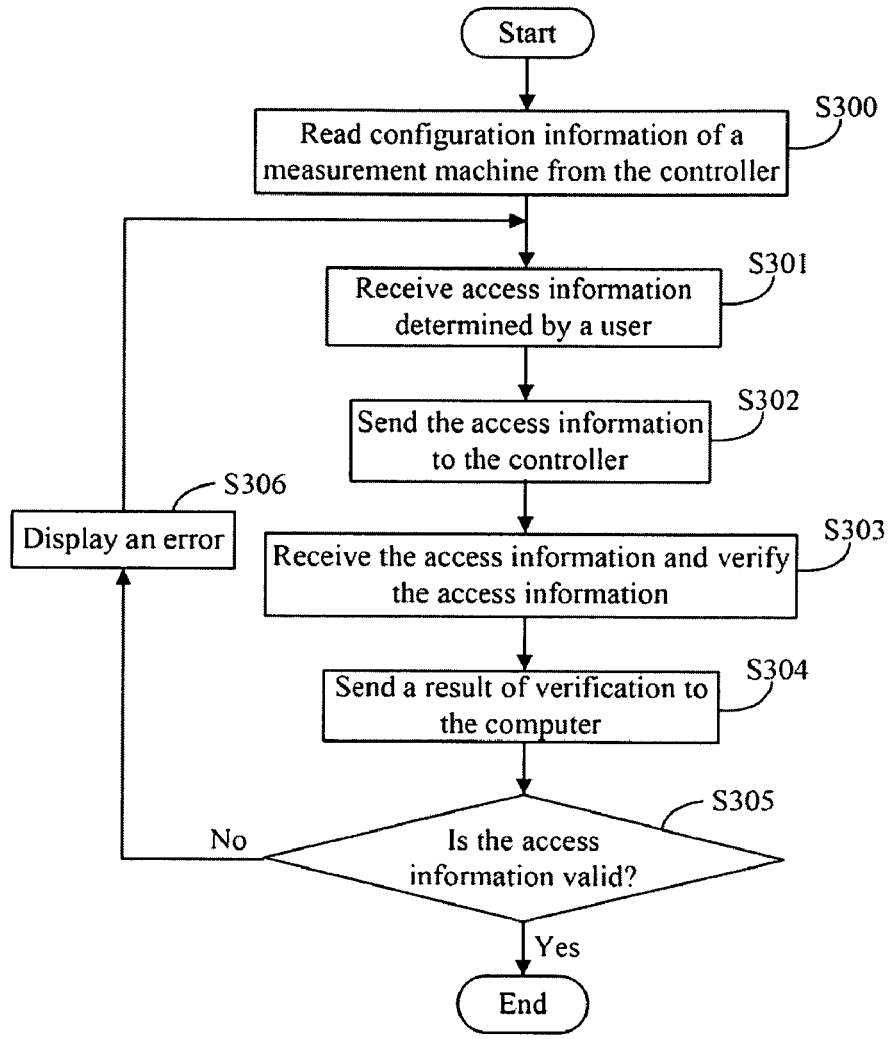
FIG. 3 is a detailed flowchart illustrating one embodiment of verifying access information.

FIG. 3 is a detailed flowchart illustrating one embodiment of verifying access information. In block S300, the computer 1 reads configuration information of a measurement machine from the controller 2. It may be understood that the system 6 is used for controlling lights of the measurement machine. The configuration information may include an accession number, a production date, and a software version number.

In block S301, the computer 1 receives access information determined by a user. The computer 1 may provide a user interface for receiving access information. The user interface may show the accession number, the production date, and the software version number.

In block S302, the computer 1 sends the access information to the controller 2.

In block S303, the controller 2 receives the access information and verifies the access information. It may be understood that the controller 2 stores standard access information in its built-in memory. If the access information is identical to the standard access information stored, then the controller 2 determines the access information is valid. Otherwise, if the access information is not identical to the access information stored, then the controller 3 determines the access information is invalid.

In block S304, the controller 2 sends a result of verification to the computer 1.

In block S305, the computer 1 checks if the access information is valid based on the result. If the access information is valid, then the procedure goes to end. Otherwise, if the access information is invalid, in block S306, then the computer 1 displays an error of invalid access information, and the procedure moves to block S301.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A system for controlling multiple light sources, the system comprising:
   a controller configured for receiving light control data for at least one light circuit, and for determining a digital luminance signal and an encoded address for each light circuit according to the light control data, wherein each light circuit is configured for controlling a light source included in the light circuit;
   a digital to analog converter (DAC) connected to the controller, the DAC configured for receiving the digital luminance signal and the encoded address for each light circuit from the controller, converting the digital luminance signal into an analog luminance signal, and for outputting the analog luminance signal according to the encoded address; and
   at least one power amplifier connected to the DAC, each power amplifier corresponding to one light circuit and configured for receiving the analog luminance signal from the DAC, and amplifying the analog luminance signal for the light circuit so as to drive the light circuit to control a light source corresponding to the light circuit;
   wherein the controller connects to a computer for receiving a plurality of communication parameters of a communication between the computer and the controller, and displaying errors when the communication parameters are incorrect, the errors comprising an invalid serial port number for the computer, an error of invalid access information, and a data transmission error between the computer and the controller.

2. The system as claimed in claim 1, wherein the encoded address is a binary code.

3. The system as claimed in claim 1, wherein the digital luminance signal is stored in a built-in memory of the controller.

4. The system as claimed in claim 1, wherein the controller is selected from a group consisting of a single chip microcomputer, a digital signal processor, and a programmable logic controller.

5. The system as claimed in claim 1, wherein the controller receives the light control data via the computer.

6. The system as claimed in claim 5, wherein the controller is further configured for verifying access information before receiving the light control data via the computer.

7. A method for controlling multiple light sources, the method comprising:
   receiving a plurality of communication parameters of a communication between a computer and a controller, and determining if the communication parameters are correct;
   upon the condition that the communication parameters are incorrect, displaying errors during the process of controlling each of the light sources, the errors comprising an invalid serial port number for the computer, an error of invalid access information, and a data transmission error between the computer and the controller; or
   upon the condition that the communication parameters are correct, performing steps (a) to (e):
   (a) receiving light control data for at least one light circuit, wherein each light circuit is configured for controlling a light source included in the light circuit;

(b) determining a digital luminance signal and an encoded address for each light circuit according to the light control data;
(c) sending the digital luminance signal and the encoded address to a digital to analog converter (DAC);
(d) converting the digital luminance signal into an analog luminance signal, and outputting the analog luminance signal to a power amplifier according to the encoded address; and
(e) amplifying the analog luminance signal so as to drive the light circuit to control a light source corresponding to the light circuit.

8. The method as claimed in claim 7, wherein the encoded address is a binary code.

9. The method as claimed in claim 7, wherein the digital luminance signal is stored in a built-in memory of the controller.

10. The method as claimed in claim 7, wherein block (a) to block (c) is executed by one of a group consisting of a single chip microcomputer, a digital signal processor, and a programmable logic controller.

* * * * *